United States Patent
Von Kaenel

(10) Patent No.: US 7,678,645 B2
(45) Date of Patent: Mar. 16, 2010

(54) FORMATION OF THIN SEMICONDUCTOR LAYERS BY LOW-ENERGY PLASMA ENHANCED CHEMICAL VAPOR DEPOSITION AND SEMICONDUCTOR HETEROSTRUCTURE DEVICES

(75) Inventor: Hans Von Kaenel, Zurich (CH)

(73) Assignee: Eidgenoessische Technische Hochschule Zuerich, Zuerich (CH)

( * ) Notice: Subject to any disclaimer, the term of this patent is extended or adjusted under 35 U.S.C. 154(b) by 671 days.

(21) Appl. No.: 10/550,855

(22) PCT Filed: Mar. 26, 2003

(86) PCT No.: PCT/EP03/03136

§ 371 (c)(1),
(2), (4) Date: Sep. 18, 2006

(87) PCT Pub. No.: WO2004/085717

PCT Pub. Date: Oct. 7, 2004

(65) Prior Publication Data

US 2007/0003696 A1    Jan. 4, 2007

(51) Int. Cl.
*H01L 21/8242* (2006.01)
(52) U.S. Cl. ............... 438/248; 438/758; 257/E21.103
(58) Field of Classification Search .................. 438/248; 257/E21.103
See application file for complete search history.

(56) References Cited

U.S. PATENT DOCUMENTS 6,454,855 B1    9/2002  Von Kaenel et al.
2002/0056414 A1  5/2002  Shim et al.

2002/0139996 A1  10/2002  Jagannathan

FOREIGN PATENT DOCUMENTS

EP    1 315 199    5/2003

(Continued)

OTHER PUBLICATIONS

Rosenblad et al., "Low-temperature heteroepitaxy by LEPECVD", Thin Solid Films 318 (1998) pp. 11-14.*

(Continued)

*Primary Examiner*—W. David Coleman
*Assistant Examiner*—Sonya D McCall-Shepard
(74) *Attorney, Agent, or Firm*—Moetteli & Associates SàRL

(57) ABSTRACT

Method for forming a highly relaxed epitaxial semiconductor layer (52) with a thickness between 100 nm and 800 nm in a growth chamber includes four principle steps. In a first step, the method provides a substrate (51) in the growth chamber on a substrate carrier. In a second step, the method maintains a constant substrate temperature ($T_S$) of the substrate (51) in a range between 350° C. and 500° C. In a third step, the method establishes a high-density, low-energy plasma in the growth chamber such that the substrate (51) is being exposed to the plasma. In a fourth step, the method directs Silane gas ($SiH_4$) and Germane gas ($GeH_4$) through the gas inlet into the growth chamber, the flow rates of the Silane gas and the Germane gas being adjusted in order to form said semiconductor layer (52) by means of vapor deposition with a growth rate in a range between 1 and 10 nm/s. The semiconductor layer (52) has a Germanium concentration x in a range between 0<x<50%.

13 Claims, 6 Drawing Sheets

FOREIGN PATENT DOCUMENTS

| | | |
|---|---|---|
| WO | WO/98/58099 | 12/1998 |
| WO | WO/03/044839 | 5/2003 |

OTHER PUBLICATIONS

Rosenblad et al., "Epitaxial growth at high rates with LEPECVD", Thin Solid Films 336 (1998) pp. 89-91.*

Hackbarth et al., "Alternatives to thick MBE-grown relaxed SiGe buffers", Thin Solid Films 369 (2000) pp. 148-151.*

Kasper et al., New virtual substrate concept for vertical MOS transistors, Thin Solid Films, vol. 336, p. 319-22 (1998).

Bauer et al., Relaxed SiGe buffers with thicknesses below 0.1 um, Thin Solid Films, vol. 369, p. 152-56 (2000).

Hackbarth et al., Alternatives to thick MBE-grown relaxed SiGe buffers, Thin Solid Films, vol. 369, p. 148-51 (2000).

Ueno et al., Low temperature buffer growth for modulation doped SiGe/Ge/SiGe heterostructures with high hole mobility, Thin Solid Films, vol. 369, p. 320-23 (2000).

Kuchenbecker et al., Thin SiGe buffer layer growth by in situ low energy hydrogen plasma preparation, Thin Solid Films, vol. 389, p. 146-52 (2001).

Fitzgerald et al., Totally relaxed $GeXSi1-X$ layers with low threading dislocation densities grown on Si substrates, Appl. Phys. Lett., vol. 59, p. 811-13 (1991).

Ismail et al., Extremely high electron mobility in Si/SiGe modulation-doped heterostructures, Appl. Phys. Lett., vol. 66, p. 1077-79 (1995).

Linder et al., Reduction of dislocation density in mismatched SiGe/Si using a low-temperature Si buffer layer, Appl. Phys. Lett., vol. 70, p. 3224-26 (1997).

Li et al., Relaxed $Si0.7Ge0.3$ layers grown on low-temperature Si buffers with low threading dislocation density, Appl. Phys. Lett., vol. 71, p. 3132-34 (1997).

Peng et al., Relaxed $Ge0.9Si0.1$ alloy layers with low threading dislocation densities grown on low-temperature Si buffers, Appl. Phys. Lett., vol. 72, p. 3160-62 (1998).

Rosenblad et al., A plasma process for ultrafast deposition of SiGe graded buffer layers, Appl. Phys. Lett., vol. 76, p. 427-29 (2000).

Von Kaenel et al., Very high hole mobilities in modulation-doped Ge quantum wells grown by low-energy plasma enhanced chemical vapor deposition, Appl. Phys. Lett., vol. 80, p. 2922-24 (2002).

Murota et al., Low-Temperature Epitaxial Growth of $Si/Si1-XGeX/Si$ Heterostructure by Chemical Vapor Deposition, Jpn. J. Appl. Phys., vol. 33, p. 2290-99 (1994).

Chen et al., Low-temperature buffer layer for growth of a low-dislocation-density SiGe layer on Si by molecular-beam epitaxy, J. Appl. Phys., vol. 79, p. 1167-69 (1996).

Weitz et al., Tilted magnetic field studies of spin- and valley-splittings in $Si/Si1-XGeX$ heterostructures, Surf. Sci., vol. 361/362, p. 542-46 (1996).

Schuegraf et al., Handbook of thin-film deposition processes and techniques, Noyes Publications, New Jersey, US, p. 26-79 article by M.L. Hammond (1988).

Mantl et al., Strain relaxation of epitaxial SiGe layers on Si(100) improved by hydrogen implantation, Nucl. Instr. and Meth. in Phys. Res., vol. B 147, p. 29-34 (1999).

Hollaender et al., Enhanced strain relaxation of epitaxial SiGe layers on Si(100) after H+ ion implantation, Nucl. Instr. and Meth. in Phys. Res., vol. B 148, p. 200-05, (1999).

Hollaender et al., Strain relaxation of pseudomorphic $Si1-XGeX/Si(100)$ heterostructures after hydrogen or helium ion implantation for virtual substrate fabrication, Nucl. Instr. and Meth. in Phys. Res., vol. B 175-177, p. 357-67 (2001).

Herzog et al., Si/SiGe n-MODFETs on Thin SiGe Virtual Substrates Prepared by Means of He Implantation, IEEE Electron Device Letters, vol. 23, p. 485-87 (2002).

Lyutovich et al., Thin SiGe buffers with high Ge content for n-MOSFETs, Materials Science and Engineering, vol. B89, p. 341-45 (2002).

* cited by examiner

FORMATION OF THIN SEMICONDUCTOR LAYERS BY LOW-ENERGY PLASMA ENHANCED CHEMICAL VAPOR DEPOSITION AND SEMICONDUCTOR HETEROSTRUCTURE DEVICES

The present application is the US national stage of International Application no. PCT/EP2003/003136, filed 26 Mar. 2003.

The present invention concerns the formation of thin semiconductor layers, in particular silicon-germanium layers, by means of a plasma enhanced chemical vapor deposition process, and semiconductor heterostructure devices made by means of the plasma enhanced chemical vapor deposition process.

BACKGROUND OF THE INVENTION

New materials and material compositions are being employed in industry in order to improve semiconductor devices such as transistors, for example. This allows one to improve the processing speed and performance of integrated circuits (ICs). A typical example is the deployment of a thin strained silicon film on top of a relaxed Silicon-Germanium (SiGe) buffer layer, on a Silicon (Si) substrate.

A conventional approach of using relaxed graded SiGe layers as buffers is now described. The concept of graded SiGe buffer layers was invented in 1991 by Fitzgerald et al. The results of their work are described in F. A. Fitzgerald, Y.-H. Xie, M. L. Green, D. Brasen, A. R. Kortan, J. Michel, Y.-J Mii, and B. E. Weir, Appl. Phys. Lett., Vol. 59, p. 811, 1991. Such buffer layers are used as virtual substrates (VS) for applications in the area of high-speed electronics by means of metal-oxide semiconductor field-effect transistors (MOSFETs) and modulation-doped field-effect transistors (MODFETs) based on strained Si or $Si_{1-x}Ge_x(0<x\leq1)$. The active layers (e.g., Si) on top of a VS are strained because the VS has a lattice parameter intermediate between that of Si and Ge.

In the graded buffer approach, the Ge concentration x in a $Si_{1-x}Ge_x$ alloy is raised in a linear or step-wise fashion from zero up to some final value $x_f$.

In this way, dislocations are distributed in a larger volume compared to a SiGe film with constant composition, where they reside basically at the interface. As a result, threading dislocation (TD) arms become more mobile, long misfit segments are formed (ideally across the whole wafer) and the density of TDs piercing the active layers of devices, and spoiling their performance, is reduced.

To date, the highest low-temperature electron and hole mobilities in strained Si channels were reported in the following two papers: K. Ismail, M. Arafa, K. L. Saenger, J. O. Chu, and B. S. Meyerson, in Appl. Phys. Lett., Vol. 66, p. 1077, 1995; P. Weitz, R. J. Haug, K. Von Klitzing, and F. Schäffler, in Surf. Sci. 361/362, p. 542, 1996; and in strained Ge channels by H. von Känel, M. Kummer, G. Isella, E. Müller, and T. Hackbarth, in Appl. Phys. Lett., Vol. 80, p. 2922, 2002. This has been achieved using VS based on Fitzgerald's concept.

Conventional VS are, however, typically several microns thick because the grading rates have to be kept low (typically around 10%/µm) to assure low TD densities. Such VS are therefore very time consuming to fabricate with conventional growth techniques.

There does, however, exist a fast deposition process, called low-energy plasma-enhanced chemical vapor deposition (LEPECVD) by means of which time and material consumption has been minimized. The basic process, applied only to Si and SiGe films of a "quality sufficient for epitaxy", is described and claimed in the US patent with patent number U.S. Pat. No. 6,454,855 B1, and in a pending PCT application published as WO 98/58099.

For the application of LEPECVD to p-MODFETs, a European patent application was filed on 22 Nov. 2001. Application number 01127834.8 was assigned. Subsequently, a PCT patent application was filed on 5 Sep. 2002 and the international application number PCT/EP 02/09922 was assigned. In the context of these applications 01127834.8 and PCT/EP 02/09922, the LEPECVD is used to grow thick graded relaxed SiGe layers. It is a disadvantage of thick graded SiGe buffer layers, that their thermal conductivity is relatively low. When using a substrate with such a thick SiGe buffer layer, heat dissipation might be a problem in particular in highly integrated circuits. If one uses a substrate with a thick SiGe buffer layer, the integration of Si circuits is difficult, since there are substantial differences in heights (large step heights) between the buffer and those areas where the buffer has been removed by means of etching. Photolithography on such a structured surface is difficult due to focusing problems, for instance.

Even though VS based on thick graded relaxed buffer layers can now be economically grown, e.g., by LEPECVD, the thick VS concept implies major disadvantages, such as
- poor thermal conductivity, leading to problems with heat dissipation for SiGe devices, as mentioned above,
- large surface roughness due to cross-hatch, requiring chemical mechanical polishing
- problems with integration because of large step heights due to large SiGe layer thickness, as mentioned above.

In the following, thin relaxed buffer layers serving as VS are addressed. In the past few years many attempts have been made to overcome the shortcomings of thick conventional graded buffers, aiming at a substantial reduction of buffer layer thickness to the range of 100-500 nm. In almost all cases these efforts have been carried out by means of solid source molecular beam epitaxy (MBE), which is not a suitable technique for large scale production. One notable exception is the work by K. K. Linder et al., who used gas-source molecular beam epitaxy and ultrahigh vacuum chemical vapor deposition. For details please refer to K. K. Under et al., Appl. Phys. Lett., Vol. 70, p. 3224, 1997. These processes are, however, extremely slow, of the order of a mono-layer per minute or less, at the low substrate temperatures required.

The most serious disadvantage of MBE is the limited capacity of the evaporation crucibles. This is a disadvantage in particular when growing SiGe-buffer layers having a thickness of up to 500 nm. MBE is thus not well suited for industrial production of devices comprising SiGe layers.

CVD processes in general, are not deemed to be suitable for deposition at low substrate temperatures even for VS thinner than ~500 nm. In the "Handbook of thin-film deposition processes and techniques ed. Klaus. K. Schuegraf, Noyes Publications, New Jersey, USA, 1988, ISBN: 0-8155-1153-1, p. 26 through 79, there is an overview article by M. L. Hammond addressing Si epitaxy using CVD. It is clear from this article that there is an exponential decrease of the growth rate as the substrate temperature decreases. Estimates based on figures from various publications indicate that Si would grow at a rate between 0.01 nm/min and 0.0001 nm/min if using a CVD process at about 400° C. A SiGe alloy layer would probably grow at a rate that is certainly below 1 nm/min (0.0166 nm/s) if one were to use a CVD process at about 400° C.

One concept that was investigated is the deposition of a low temperature Si buffer before SiGe growth. The idea of this so-called low-temperature silicon (LT-Si) buffer was introduced by H. Chen et al., J. Appl. Phys., Vol. 79, p. 1167, 1995. Chen proposed a two-step growth process. It is based on the following premise: Silicon epitaxially grown at low substrate temperatures (typically of the order of 400° C.) contains a high concentration of point defects. These point defects may diffuse to the interface during subsequent SiGe growth at higher substrate temperature, and promote the nucleation of dislocation loops. Relaxation of the SiGe film therefore no longer requires formation of dislocation half-loops at the surface. Since the half-loops are associated always with two TDs, reducing their density should also reduce the density of TDs.

It is a disadvantage of this two-step growth process that it appears to fail at Ge concentrations x above ~30%. It is, however, applicable to higher x if layers are grown in more than one step (cf. C. S. Peng et al., Appl. Phys. Lett., Vol. 72, p. 3160, 1998). Such a procedure is evidently time consuming.

Another two-step growth process starts with the epitaxial growth of SIGe at ultra-low temperatures. According to this concept, advocated by E. Kasper et al. in Thin Solid Films, Vol. 336, p. 319, 1998, it is the SiGe film itself which is grown in a first step at very low temperatures of the order of 200° C. by MBE. In a second step, the VS is completed by growing the film to its final thickness at a higher temperature (cf. M. Bauer et al. in Thin Solid Films Vol. 369, p. 152, 2000). The idea here is that point defects in the film should help dislocations with opposite Burgers vector to annihilate, because of dislocation climb. Furthermore, as in the case of LT-Si, condensation of point defects can result in the formation of dislocation loops inside the SiGe layer, avoiding dislocation nucleation from surface sites. It is a disadvantage of the concept advocated by E. Kasper et al., that it requires MBE.

Another approach is the post SiGe growth hydrogen ion Implantation or H-cleaning plus annealing. In this approach, described by S. Mantl et al. in Nucl. Instr. and Meth. in Phys. Res., Vol. B 147, p. 29, 1999, and by B. Holländer et al. in Nucl. Instr. and Meth. In Phys. Res., Vol. B 148, p. 200, 2000, hydrogen is implanted at some depth below the SiGe epilayer. In the subsequent annealing steps, micro cavities form which seem to promote the nucleation of dislocation loops. The latter can extend at the interface and act as misfit segments enabling strain relaxation.

An alternative method has been proposed by J. Kuchenbecker et al. in Thin Solid Films, Vol. 389, p. 146, 2001. In this paper, the Si wafer is exposed to a low-energy hydrogen plasma, and annealed for a short time, before the epitaxial growth of the SiGe layer by MBE. Similar to H-implantation, this process induces cavities below the interface, which again promote relaxation of the SiGe film upon annealing.

It is regarded as a disadvantage of these approaches, that for growth in one single step, Ge concentrations in the VS appear to be limited to approximately 20%.

Another approach—which is essentially similar to the previous one—is referred to as post SiGe growth helium ion implantation plus annealing. It differs from the previous approach in that the implanted species is He rather than H. It has, however, been shown to work up to Ge concentrations of 30% (cf. B. Holländer et al., Nucl. Instr. and Meth. In Phys. Res. B 175-177, p. 357, 2001). Transistor data obtained on 95 nm thick $Si_{0.69}Ge_{0.31}$ VS are comparable to those obtained on conventional graded VS (cf. H.-J. Herzog et al., IEEE Electron Device Letters, Vol. 23, p. 485, 2002.

VS growth by hydrogen and He implantation plus annealing could be used in industrial production, provided that the SiGe layers are grown by a gas phase process rather than by MBE, as In all publications mentioned above.

As addressed above, several approaches have been suggested and implemented to decrease the thickness of the VS to below ~500 nm. While partially successful from a scientific point of view, all these approaches rely for the most part on processes unsuitable for large scale production.

It is a disadvantage of the known CVD approaches that the growth rate is low. Since a certain minimum thickness of ~100 nm of the semiconductor layer (e.g., a SiGe VS) is required, the formation of this layer takes quite some time when using conventional approaches. This is, however, highly unfavorable for industrial mass production.

It is an object of the present invention to provide a method for making thin, highly relaxed semiconductor layers using processes suitable for large scale production.

It is an object of the present invention to provide a method for making SiGe layer(s) having a high degree of relaxation.

It is an object of the present invention to provide heterostructure devices made by such methods.

SUMMARY OF THE PRESENT INVENTION

The present invention relies on a low-energy plasma enhanced chemical vapor deposition (LEPECVD) process.

According to the present invention, a method for forming thin (between 100 nm and 800 nm) highly relaxed semiconductor layers is proposed. It comprises the following steps:
  providing a substrate (e.g., a silicon wafer) in a growth chamber on a substrate carrier,
  maintaining a constant substrate temperature (Ts) of the substrate in a range between 350° C. and 500° C.,
  establishing a high-density, low-energy plasma in the growth chamber such that the substrate is being exposed to the plasma,
  directing Silane gas ($SiH_4$) and Germane gas ($GeH_4$) through the gas inlet into the growth chamber, the flow rates of the Silane gas and the Germane gas being adjusted in order to form said semiconductor layer by means of low-energy plasma enhanced chemical vapor deposition with a growth rate in a range between 1 and 10 nm/s, said semiconductor layer having a Germanium concentration in a range between $0<x<50\%$.

Various advantageous methods are claimed in the dependent claims 2 through 17.

According to the present invention, heterostructure semiconductor devices are proposed. Such a device comprises a substrate, a $Si_{1-x}Ge_x$ layer with constant concentration x of Ge, and an active region being situated above said $Si_{1-x}Ge_x$ layer. The $Si_{1-x}Ge_x$ layer has a thickness between 100 nm and 800 nm and a degree of relaxation of at least 75%.

Various advantageous devices are claimed in the dependent claims 19 through 22.

In contrast to those processes and approaches described above, the present invention concerns a gas phase process suitable for semiconductor production. None of the other well-known gas phase processes, atmospheric pressure chemical vapor deposition (APCVD), reduced pressure CVD (RPCVD), low pressure CVD (LPCVD), ultra-high vacuum CVD (UHV-CVD), is applicable at the low substrate temperatures in question, because of their exceedingly low deposition rates (mono-layers per minute or less).

The fabrication of a VS suitable for n-MODFET or MOSFET production requires, according to the present Invention, one single substrate temperature only during the growth plus one subsequent annealing step. This annealing step is optional.

In the mixed MBE/LEPECVD technology described and claimed below, this annealing step is part of the substrate preparation prior to active layer growth by MBE.

The fabrication of a thin VS suitable for p-MODFET or MOSFET production requires at most two substrate temperatures during growth.

It is another advantage of the present invention that the process is fast. The deposition of the thin VS requires less than 5 min for all relevant Ge concentrations and thicknesses. All prior art gas phase processes described above are slower by at least a factor of $10^3$. In this comparison only the actual deposition time is counted. Taking into account the time consuming variation of substrate temperatures, the competing processes are even slower.

The process presented herein is characterized in that a one-step fabrication of a thin SiGe VS is possible for Ge concentrations up to 50%.

It is another advantage of the invention presented herein, that the obstacles and disadvantages of known approaches can be circumvented or even avoided. The growth rate was drastically increased thus allowing the inventive process to be used for industrial manufacturing of semiconductor devices. Further advantages become obvious from the detailed description.

BRIEF DESCRIPTION OF THE DRAWINGS

For a more complete description of the present invention and for further objects and advantages thereof, reference is made to the following description, taken in conjunction with the accompanying drawings, in which.

DETAILED DESCRIPTION

Figure 1:
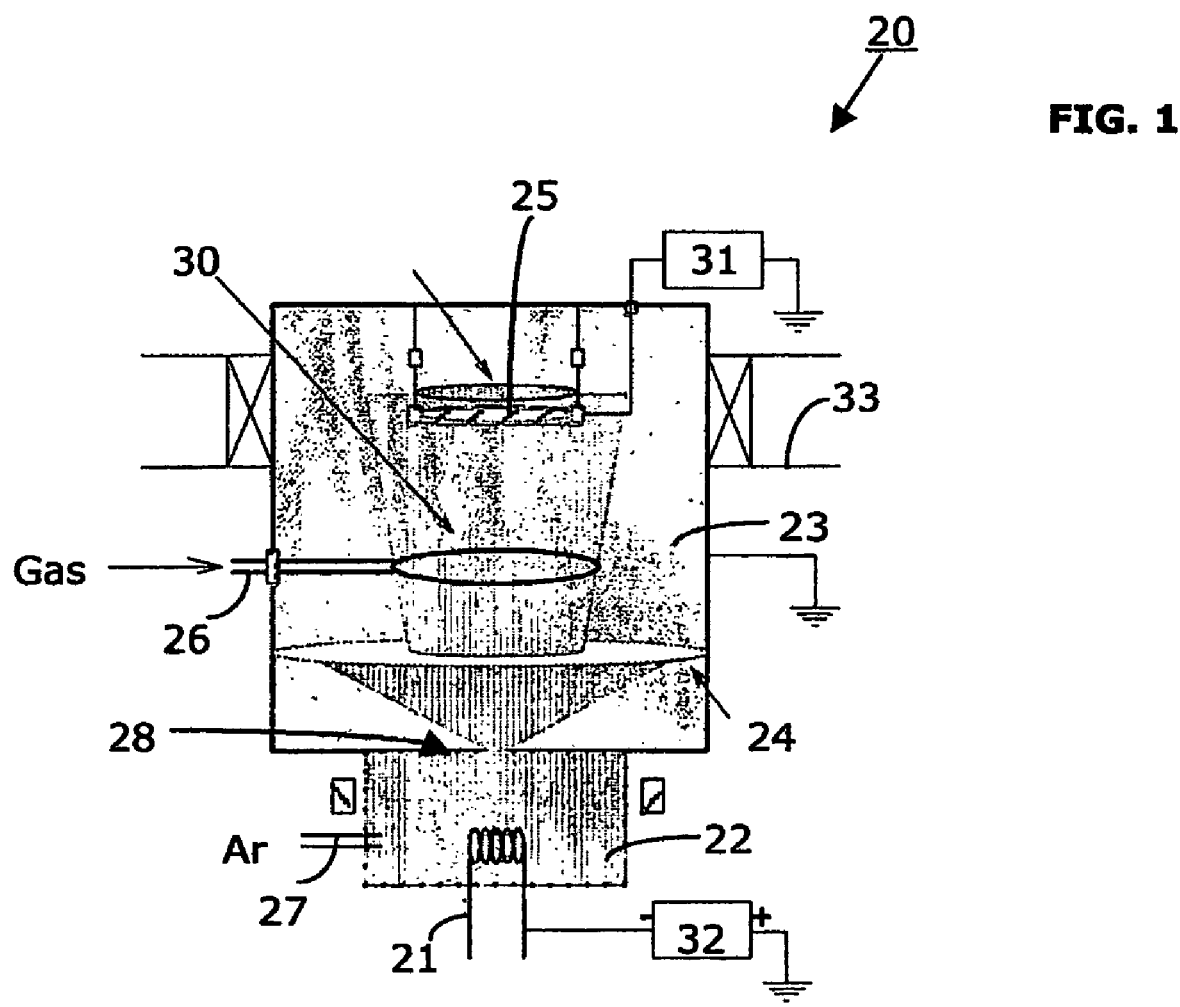
FIG. 1 is a schematic cross-section of a low-energy plasma enhanced chemical vapor deposition (LEPECVD) system, according to the present invention.

The present invention relies on low-energy plasma enhanced chemical vapor deposition (LEPECVD). A typical LEPECVD system 20 is depicted in FIG. 1. LEPECVD is based on a low-voltage DC arc discharge between a hot filament 21 in a plasma chamber 22 and the walls of the growth chamber 23 and/or an auxiliary anode 24. A Si substrate 25 on which a thin highly relaxed SiGe semiconductor layer is to be formed in a one-step process is exposed directly to the high-intensity but low-energy plasma. The substrate potential is around −12 V, for example, in order to exclude any damage of the substrate 25 by high-energy ions. An appropriate bias may be applied to the substrate 25 by means of a bias control unit 31 in order to guarantee this value. It is also possible to use a floating substrate 25 where no bias is applied during deposition which means that the substrate potential is not externally controlled during deposition.

The LEPECVD is characterized in that the plasma potential is close to 0V. The necessary reactive gases, e.g., Silane ($SiH_4$) and Germane ($GeH_4$), are fed through a port 26 and a gas inlet 30 directly into the growth chamber 23, while the argon (Ar) discharge gas is supplied through a port 27 to the plasma chamber 22 attached to the growth chamber 23 and separated from it by a small orifice 28. The high intensity of the plasma leads to very efficient cracking of the precursor gases (e.g., $SiH_4$, $GeH_4$), resulting in extraordinarily high growth rates of SiGe films. The growth rates are further enhanced by confining the plasma by a magnetic field generated by coils wrapped around the growth chamber 23. An appropriate voltage is used to drive an alternating current through the filament 21. This current (about 130 A in the present embodiment) heats the filament 21 to the desired temperature. In addition, a DC voltage source 32 (about 25V) between the filament 21 and ground is used to generate the arc discharge. In the present system 20, the density of the arc current at or near the substrate 25 is at least 0.2 $A/cm^2$. Preferably, the density of the arc current is adjusted to be greater than 0.3 $A/cm^2$.

Further details of LEPECVD systems are addressed in the above-mentioned PCT patent application WO 98/58099, for example. Details of this PCT patent application are Incorporated by means of reference.

It is an advantage of an LEPECVD system that very high plasma densities can be achieved. According to the present invention, such a high density plasma is used for the growth of a thin semiconductor layer (virtual substrate). The cracking of the reactive gases is very efficient in a high density plasma thus increasing the growth kinetics. Extremely high growth rates of up to 10 nm/s are possible at substrate temperatures $T_S$ between 350° C. and 500° C. In contrast to conventional chemical vapor deposition (CVD) systems, the growth rate in an LEPECVD system is almost completely independent of the substrate temperature in the given temperature range.

Furthermore, it has been demonstrated that according to the present invention the SiGe growth rate in an LEPECVD system is almost independent of the concentration of the gas reactants in the growth chamber at a constant total flow, whereas in conventional CVD systems there is a strong dependency between the growth rate and the gas concentrations. It is thus an advantage of the present system, that larger thickness and composition can be more easily controlled.

Using an LEPECVD system to carry out the inventive process steps, synthetic devices having a thin virtual substrate can be grown at very high growth rates in a range between 1 and 10 nm/s. Typical growth rates in an MBE system are between 0.1 and 0.3 nm/s. The growth rates In a UHV-CVD system are at least another order of magnitude lower at comparable substrate temperatures.

According to the present invention, a new one-step gas phase process based on LEPECVD is proposed which has the following characteristics:

low substrate temperatures $T_S$ between 350° and 500° C.;

the substrate temperature $T_S$ is kept constant during deposition of the entire VS;

SiGe deposition rates in a range between 1 nm/s and 10 nm/s, and preferably on the order of 2 nm/s;

SiGe layer thicknesses in a range between 100 nm and 800 nm.

Furthermore, during the formation of the virtual substrate the density of the plasma is kept at a high level.

Subsequent to the forming of the thin semiconductor layer (VS), an optional annealing step may be carried out. The annealing, according to the present invention, is done at moderate temperatures (typically in a range between 600° C. and 870° C.) before growth of an active layer stack, for instance. Rapid thermal annealing (RTA) is particularly well suited for being used in connection with the present invention.

According to the present invention, the substrate temperature $T_s$ is not altered during formation of the thin virtual substrate. That is, according to the present invention, the substrate temperature $T_S$ is maintained constant during the formation of the semiconductor layer, which means that the substrate temperature preferably has a maximum fluctuation of ±5%.

A method for forming a thin semiconductor layer with a thickness between 100 nm and 800 nm, in accordance with the present Invention, comprises the following steps:

- A substrate (e.g., a silicon wafer) is placed in the growth chamber (23) on a substrate carrier.
- The substrate temperature $T_S$ of the substrate is increased and then maintained at a constant substrate temperature in a range between 350° C. and 500° C. during the formation of the thin semiconductor layer. Preferably, the substrate temperature $T_S$ is kept in a range between 380° C. and 420° C.
- A high-density, low-energy plasma is established in the growth chamber (23) such that the wafer is exposed to the plasma.
- Silane gas ($SiH_4$) and Germane gas ($GeH_4$) are directed through the gas inlet 26, 30 into the growth chamber 23. The flow rates of the Silane gas and the Germane gas are adjusted in order to form said thin semiconductor layer by means of a one-step vapor deposition process with a growth rate in a range between 1 and 10 nm/s. Preferably, the growth rate is in a range between 1.5 nm/s and 4 nm/s. The thin semiconductor layer has a Germanium concentration in a range between 0<x<50%.

Contrary to what was to be expected when extrapolating experimental data from known gas phase processes, according to the present Invention, low substrate temperatures between 350° and 500° C., preferably in the range between 380° C. and 420° C., are very well suited. Not only is the growth rate at these low temperatures high, but also the quality of the layers is much better than expected. It turns out that the process parameters and the one-step process described and claimed herein especially allow thin high-quality non-graded SiGe layers to be grown with a high degree of relaxation R.

The degree of relaxation R is defined as follows. Designating the lattice parameter of the free standing alloy (that is its bulk lattice parameter) by $a_{SiGe}$, the Si lattice parameter by $a_{Si}$, and the measured lattice parameter of the epitaxial alloy parallel to the substrate interface as $a_{par}$, R is given by $R=(a_{par}-a_{Si})/(a_{SiGe}-a_{Si})$. A layer with a high degree of relaxation is herein referred to as highly relaxed layer. For the purposes of the present specification and claims, a highly relaxed layer is deemed to have a degree of relaxation of at least 75%.

The method for forming a thin highly relaxed semiconductor layer takes in any case less than 5 minutes, preferably between 1 and 4 minutes. This is another clear distinction over processes known so far.

Preferably, a <100> or <111> oriented silicon wafer is employed.

In an advantageous embodiment of the invention, the substrate has a potential of about −12 Volts and the plasma potential is close to 0 Volt.

According to another embodiment, a thin silicon buffer layer is formed on the silicon wafer prior to the forming of the thin highly relaxed semiconductor layer. The thin silicon buffer layer preferably is formed at a substrate temperature $T_S$ in a range between 700° C. and 750° C.

In an optional step, the uppermost part of the silicon wafer is treated by means of a dry-etching or wet-etching step prior to the forming of the thin semiconductor layer.

In a preferred embodiment, the total reactive gas flow at the gas inlet is kept between 5 sccm and 50 sccm so as to allow a growth rate in a range between 1 and 10 nm/s.

The relaxation of the thin semiconductor layer is a crucial point that needs to be optimized in order for this thin layer to be suited for use in the manufacturing of semiconductor devices. The process parameters (substrate temperature, . . . ) for the inventive one-step process and the characteristics of the thin semiconductor layer (Ge concentration, thickness t) are intentionally chosen to provide for a degree of relaxation of at least 75% (cf. FIG. 2).

Figure 2:
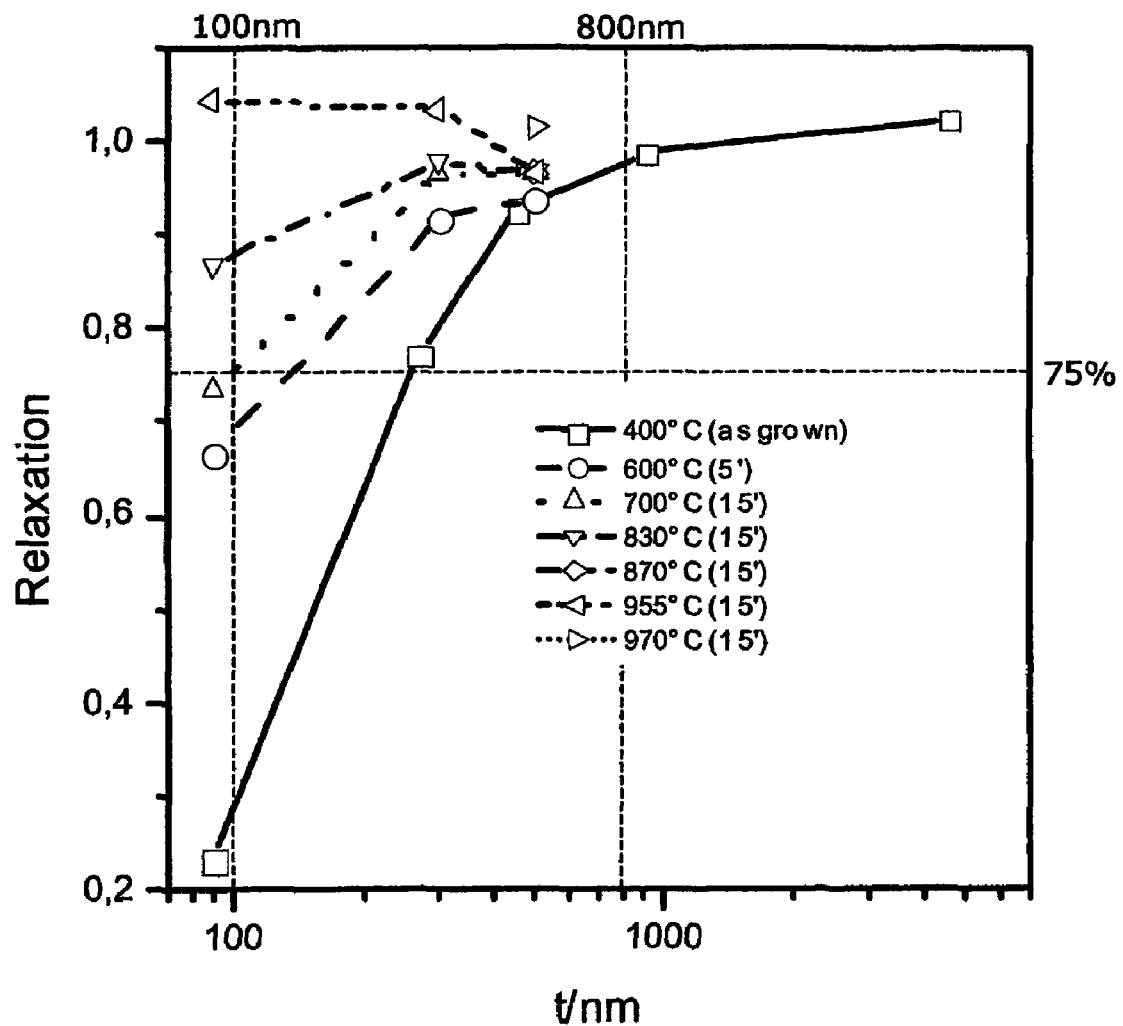
FIG. 2 is a diagram depicting the degree of relaxation as a function of the thickness t for a thin layer grown in a one-step LEPECVD, according to the invention, before and after annealing at different temperatures.

FIG. 2 shows the degree of relaxation measured by X-ray diffraction of a thin $Si_{0.56}Ge_{0.44}$ VS, as grown by LEPECVD (solid line) as a function of the layer thickness t expressed in nm. The other curves show the degree of relaxation after an optional annealing step was carried out. The annealing has been carried out at the following temperatures: 600° C., 700° C., 830° C., 870° C., 955° C., and 970° C. It should be noted that 300 to 500 nm thick films are about 97% relaxed upon annealing to 830° C. Even a 90 nm thick VS has a degree of relaxation of 87% after annealing to this temperature. Furthermore, for films thicker than ~300 nm, the final state of relaxation (about 97%) is reached already at an annealing temperature of 700° C. Annealing above 900° C. does, however, degrade the thin film and the surface quality.

The results depicted in FIG. 2 reveal that an optional annealing step may be carried out after completion of the one-step deposition of the thin semiconductor layer. The annealing step preferably is being carried out at a temperature $T_S$ in a range between 600° C. and 870° C. This leads to favorable results as far as the degree of relaxation is concerned.

The degree of relaxation achieved for the LEPECVD grown thin films described and claimed herein, compares favourably with that of similar films grown by very low temperature MBE (cf. K. Lyutovich et al., Mat. Sci. Eng. Vol. B 89, p. 341, 2002).

In the following, the surface morphology of inventive thin films is addressed. The surface structure of all thin VS with a Ge concentration below about 50% is characterized by a cross-hatch found also on thick, linearly graded buffer layers. The root mean square (rms) roughness and peak-to-valley height differences of inventive thin films are, however, substantially smaller. In other words, the thin VS are smoother than the conventional VS. This is another advantage of the inventive one-step process.

Figure 3:
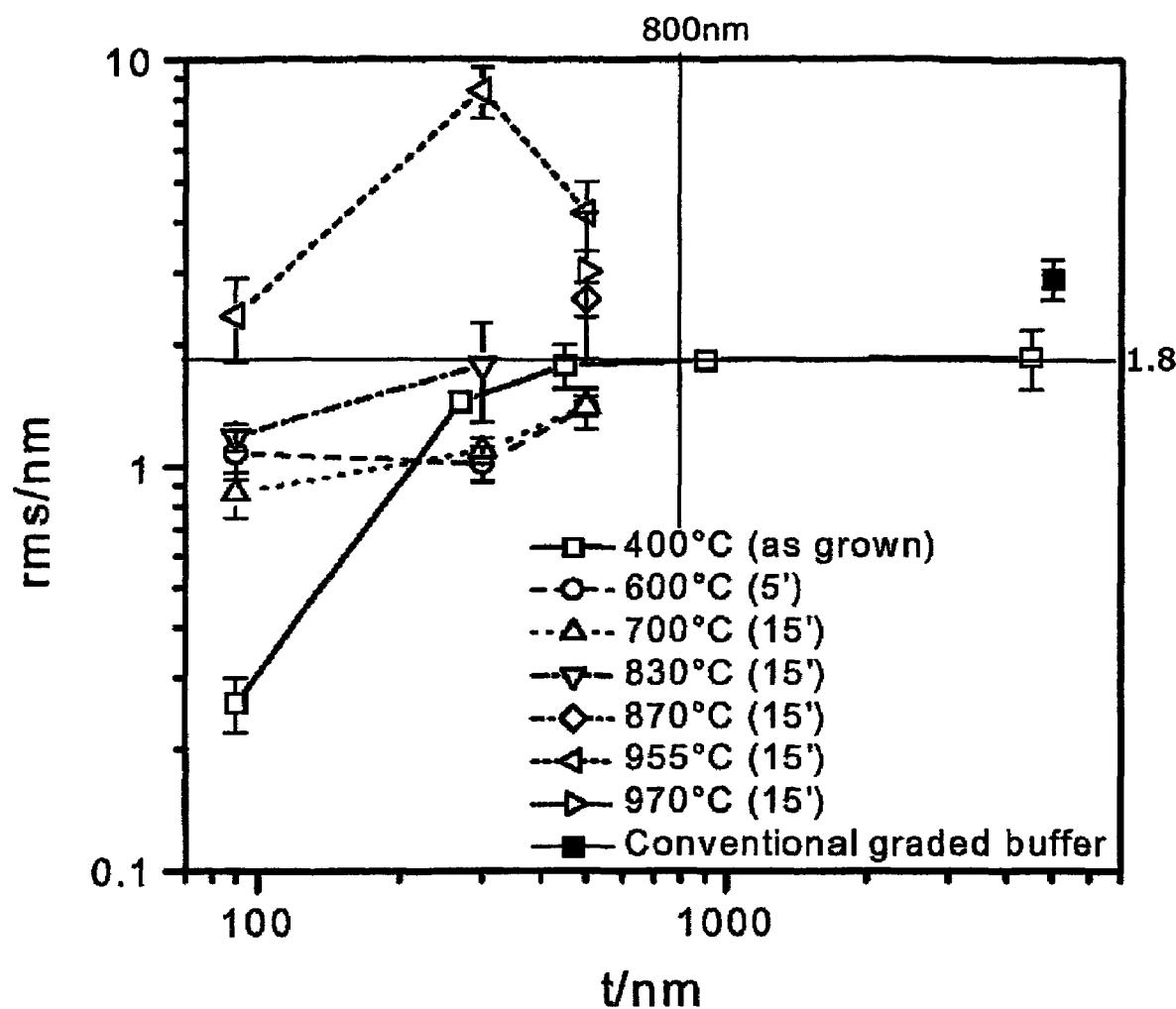
FIG. 3 is a diagram depicting the root-mean-square roughness as a function of the thickness t for a thin layer grown in a one-step LEPECVD, according to the invention, before and after annealing at different temperatures.

The surface roughness of the same thin $Si_{0.56}Ge_{0.44}$ VS samples, as in FIG. 2, has been evaluated by atomic force microscopy (AFM). The results are presented in FIG. 3. The rms values are below 1.5 nm for all VS up to a thickness t of 500 nm and below 1.8 nm for all VS up to a thickness t of 800 nm and annealing temperatures <870° C. This is substantially below the value for a conventional VS graded to the same concentration. The values compare also favourably with those in the literature obtained by MBE on comparable or lower Ge concentrations:

1.2 nm for 500 nm $Si_{0.7}Ge_{0.3}$ (J. H. Li et al., Appl. Phys. Lett., Vol. 71, p. 3132, 1997);

1.8 nm for 500 nm $Si_{0.7}Ge_{0.3}$ (C. S. Peng et al., Appl. Phys. Lett., Vol. 72, p. 3160, 1998)), ~4.9 nm for 500 nm $Si_{0.6}Ge_{0.4}$ (T. Ueno et al., Thin Solid. Films, Vol. 369, p. 320, 2000)).

An even smaller surface roughness can be achieved for VS with a higher Ge content, by using a two-step process in which a thin film semiconductor layer (alloy) with a lower Ge concentration is deposited first using the inventive one-step process, followed by an alloy layer (second semiconductor layer) with a higher Ge concentration. AFM images have been obtained on a 220 nm thick $Si_{0.28}Ge_{0.72}$ buffer layer on top of 150 nm of $Si_{0.55}Ge_{0.45}$ both grown at a substrate temperature of 400° C. Here, the cross-hatch is very faint, and the rms roughness amounts to only 0.7 nm. This may be compared with the value of 2.3 nm obtained on a $Si_{0.4}Ge_{0.6}$ buffer in the MBE work of C. S. Peng et al., Appl. Phys. Lett., Vol. 72, p. 3160, 1998.

It is an advantage of the specific set of process parameters identified above, that the thin semiconductor layer shows a self-relaxation during formation. This allows a thin semiconductor layer to be formed that has a relaxation of more than 75% after completion of the one-step deposition. Furthermore, thin highly relaxed semiconductor layers, according to the present invention, have a surface roughness (rms) of less than 1.8 nm and/or a peak-to-valley height difference of less than 5 nm.

According to the present invention, a further step may be carried out after the one-step deposition of the thin semiconductor layer, as addressed above. During this further step a second semiconductor layer is formed having a Germanium concentration in a range between 50<x<100%. This second semiconductor layer can be formed at a second substrate temperature $T_{S2}$. Preferably, this second substrate temperature $T_{S2}$ is similar to, or a little bit lower than the substrate temperature $T_S$ used during the one-step deposition of the thin semiconductor layer. Preferably: $T_S$-50° C.<$T_{S2}$≦$T_S$.

The new process, according to the present invention, can be combined in a mixed technology with others, such as MBE or UHV-CVD, for growth of the active layer stack on top of the thin VS. Alternatively, active layers can be grown on top of the thin VS by LEPECVD itself. The invention is thus also applicable to devices with strained channels.

Figure 4:
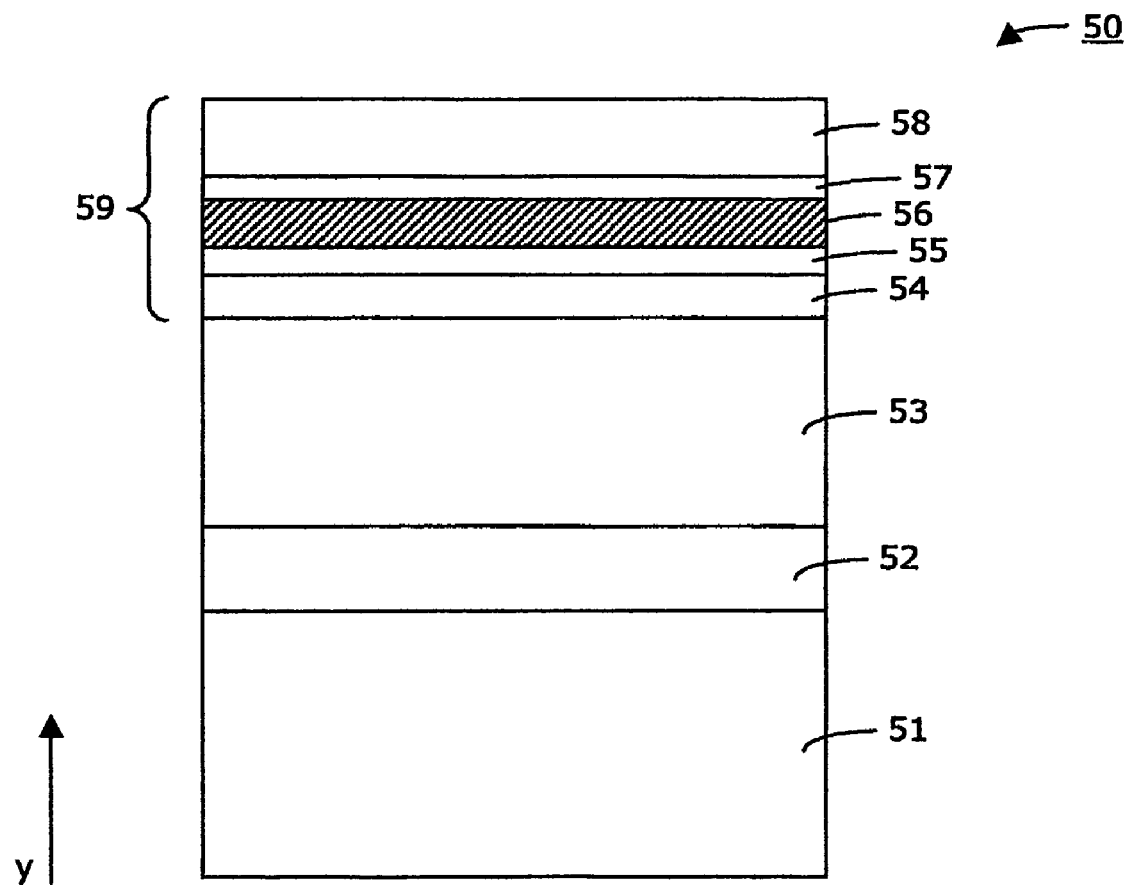
FIG. 4 is a schematic cross-section of a SiGe heterostructure semiconductor device (n-MODFET), according to the present invention.

The new process can be used in a mixed technology, together with a state of the art deposition process, such as MBE or UHV-CVD, as stated above. A schematic set-up for n-modulation doped field effect transistor (MODFET) structures is shown in FIG. 4. Please note that the thickness of the various layers are not drawn to scale. The MODFET 50 comprises the following layers. It comprises a Si substrate 51 on which a thin Si buffer 52 is formed. A <001> oriented 1500-3000 Ωcm n-type (P) or p-type (B) Si wafer may serve as Si substrate 51. The buffer 52 comprises 20 nm Si grown at 750° C. at a growth rate of 0.15 nm/s followed by 10 nm Si grown at 750° C. at a growth rate of 0.72 nm/s. On top of this buffer 52, a thin SiGe VS 53 is formed (thickness of about 500 nm). The composition of this VS 53 is: $Si_{0.58}Ge_{0.42}$. The VS 53 is grown at 400° C. at a growth rate of 2 nm/s using LEPECVD, according to the present invention. The VS 53 is not graded, i.e. the VS 53 has a constant Ge concentration where the concentration x=0.42. The following steps are now formed using an MBE-based process.

An active region 59 is situated on the VS 53. It comprises a $Si_{0.6}Ge_{0.4}$ cladding layer 54 followed by a spacer 55 above a δ-doping spike (Sb) (modulation doped layer). A Si channel 56 is situated on top of the spacer 55. The Si channel is about 10 nm thick. On top of the channel 56 there is a spacer 57 followed by a δ-doping spike (Sb) (modulation doped layer) and a $Si_{0.6}Ge_{0.4}$ cladding layer 58. Note that each of the modulation doped layers 55 and 57 only comprise one doping spike. Instead of modulation doped layers with spike, one can also use a thicker layer having a constant dopant concentration.

Electrical measurements have been performed on van-der-Pauw squares. These measurements show that the electron mobilities obtained for a VS grown by the inventive process can compete with a well established MBE reference which consists of a standard graded buffer as VS. The results with the mixed technology and thin VS fabrication by the inventive process are almost as good as those obtained by using thick conventional VS grown by LEPECVD.

It must be emphasized that in the mixed technology process described here LEPECVD and MBE steps have been carried out in two separate growth systems, requiring wet chemical cleaning of the VS and oxide desorption in the MBE prior to active layer growth. The oxide desorption in the MBE Implies an annealing step at typically 700° C. In a practical realization of the mixed technology, the two systems (LEPECVD and MBE) would be coupled in order to avoid exposure of the VS to the ambient.

Figure 5:
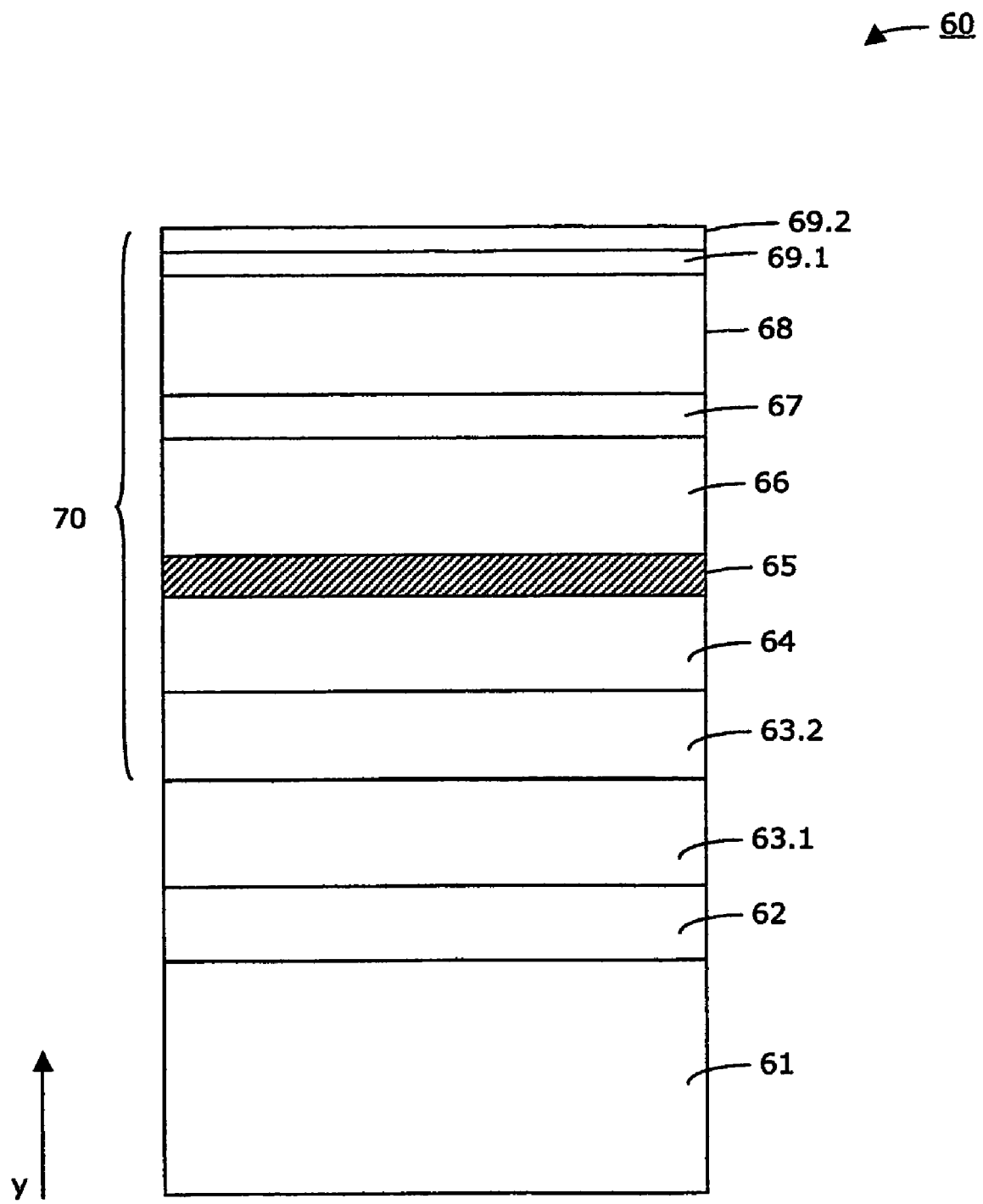
FIG. 5 is a schematic cross-section of another SiGe heterostructure semiconductor device (p-MODFET), according to the present invention.

Yet another embodiment is described in connection with FIG. 5. According to this embodiment, the thin VS and the active layer stack are grown by LEPECVD. The FIG. 5 shows the set-up for a p-MODFET structure where the VS substrate is fabricated by the inventive LEPECVD process, and the active layer stack by the LEPECVD process described in PCT/EP02/09922.

Please note that the thickness of the various layers are not drawn to scale. The p-MODFET 60 comprises the following layers. It comprises a Si substrate 61 on which a thin Si buffer 62 is formed. A <001> oriented >1000 Ωcm n-type (P) or p-type (B) Si wafer may serve as Si substrate 61. The buffer 62 comprises 17 nm Si grown at 750° C. at a growth rate of 0.1 nm/s followed by 75 nm Si grown at 750° C. at a growth rate of 0.5 nm/s. On top of this buffer 62, a thin highly relaxed SiGe VS 63.1 is formed (thickness of about 150 nm). The composition of this VS 63.1 is: $Si_{0.55}Ge_{0.45}$. The VS 63.1 is grown at 400° C. at a growth rate of 2 nm/s using a LEPECVD, according to the present invention. The VS 63.1 is not graded, i.e. the VS 63.1 has a constant Ge concentration where the concentration x=0.45. In a subsequent step a second semiconductor layer 63.2 is formed as follows: thickness 220 nm, composition $Si_{0.28}Ge_{0.72}$, LEPECVD deposition at 400° C. at a growth rate of 6.3 nm/s followed by a 5 minute annealing step (annealing temperature of about 500° C.).

An active region 70 is formed on top of the layer 63.2. All layers of the active region 70 are formed using LEPECVD. The layer 64 is a $Si_{0.3}Ge_{0.7}$ layer Having a thickness of 31 nm. A Ge channel 65 is formed next. The Ge channel 65 is 10 nm thick. A $Si_{0.3}Ge_{0.7}$ spacer 66 is deposited on the Ge channel 65. The spacer 66 is 15 nm thick. There is a modulation-doped $Si_{0.3}Ge_{0.7}$ layer 67 having two δ-doping spike (B) with 6 nm between. A 31 nm thick $Si_{0.3}Ge_{0.7}$ cladding 68 is formed on the spacer 66. A 3 nm thick $Si_{0.3}Ge_{0.7}$ layer 69.1 with one δ-doping spike (B) is formed next. Finally, a thin Si cap layer 69.2 is formed on the cladding 68. This Si cap layer 69.2 is about 3 nm thick.

The hole mobility and sheet carrier density of such a structure 60 were measured. The resulting mobility of 13'000 $cm^2$/Vs at 20K compares favourably with the 11'000 $cm^2$/Vs obtained by state of the art MBE at a comparable hole density (T. Ueno et al., Thin Solid Films, Vol. 369, p. 320, 2000). These results show that high-quality device material can be obtained by using LEPECVD with the new one-step process for VS fabrication and for active layer growth.

Figure 6:
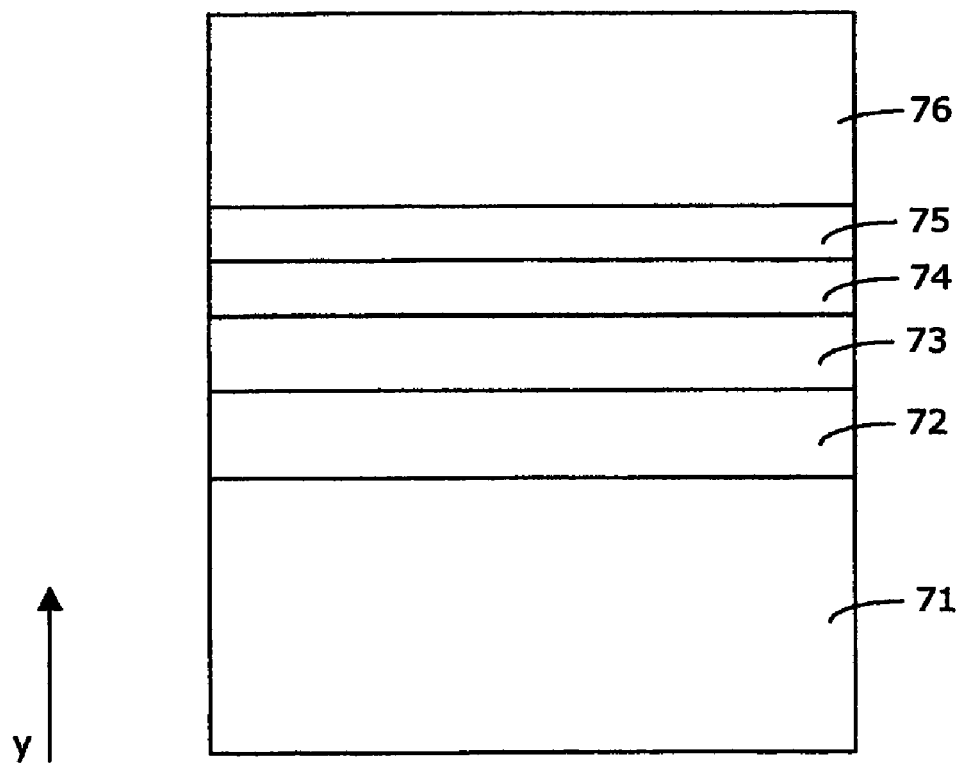
FIG. 6 is a schematic cross-section of a device, according to the present, comprising a Silicon-on-Insulator (SOI) substrate.

According to the present invention, the thin SiGe semiconductor layer can also be formed in a one-step process on top of a Silicon-on-Insulator (SOI) substrate. SiGe on a SOI substrate is very well suited for very large scale integration (VLSI) of circuits. A respective embodiment 80 is depicted in FIG. 6. The embodiment 80 comprises a Si substrate 71. A buried SiO$_2$ layer is formed on top of the substrate 71 followed by a thin Si film 73. This thin Si film has a thickness between 50 nm and 500 nm. A SiGe layer 74 is deposited by LEPECVD at low substrate temperature T$_S$. The Ge concentration is between 10% and 40%. The thickness of the SiGe layer 74 is chosen such that layer 74 is unrelaxed during deposition. In a subsequent annealing step, the SiGe layer 74 relaxes. The layers 71 through 74 serve as VS. A relaxed SiGe layer 75 is formed on top of this VS. An active layer stack 76 is situated on said SiGe layer 75. The active layer stack 76 may comprise the layers 55 through 58 of FIG. 4, for example.

As indicated by the above embodiments, the inventive process can be altered in many ways. The embodiments are not meant to limit the scope in any way.

The inventive concept is well suited for use in transistors, sensors, spectroscopy, quantum computers, solar cells, and other devices/systems. The present invention is particularly well suited to make n- and p-MODFETs as well as n- and p-MOSFETs and other CMOS circuits.

The invention claimed is:

1. Method for forming a heterostructure semiconductor device in a growth chamber with gas inlet, said method comprising the steps of:
   providing a silicon substrate in the growth chamber on a substrate carrier,
   maintaining a constant substrate temperature (T$_S$) of the substrate in a range between 350° C. and 500° C. during the deposition of a Si$_{1-x}$Ge$_x$ semiconductor layer having a thickness between 100 nm and 800 nm,
   establishing a high-density, low-energy plasma in the growth chamber such that the substrate is being exposed to the plasma,
   directing Silane gas (SiH$_4$) and Germane gas (GeH$_4$) through the gas inlet into the growth chamber, the flow rates of the Silane gas and the Germane gas being adjusted in order to form said semiconductor layer by means of low-energy plasma enhanced chemical vapor deposition with a growth rate in a range between 1 and 10 nm/s, said Si$_{1-x}$Ge$_x$ semiconductor layer having a constant Germanium concentration x in a range between 0<x<50% a degree of relaxation of at least 75%,
   performing an annealing step with a temperature in a range between 600° C. and 870° C. providing a surface roughness (rms) of said Si$_{1-x}$Ge$_x$ semiconductor layer having rms values below 1.8 nm,
   forming an active region above said Si$_{1-x}$Ge$_x$ layer.

2. The method of claim 1, whereby the forming of the semiconductor layer takes less than 5 minutes, preferably between 1 and 4 minutes.

3. The method of claim 1, whereby the substrate temperature (T$_S$) is maintained constant during the formation of the semiconductor layer, the substrate temperature (T$_S$) preferably having a fluctuation of ±5%.

4. The method of claim 1, whereby the substrate is a <100> or <111> oriented silicon wafer or a Silicon-on-Insulator (SOI) substrate.

5. The method of claim 1, whereby a thin silicon buffer layer is formed on the substrate prior to the forming of the semiconductor layer, said thin silicon buffer layer preferably being formed at a substrate temperature in a range between 700° C. and 750° C.

6. The method of claim 1, whereby the uppermost part of the substrate is treated by means of a dry-etching or wet-etching step prior to the forming of the semiconductor layer.

7. The method of claim 1, whereby the substrate temperature is in a range between 380° C. and 420° C.

8. The method of claim 1, whereby the growth rate is in a range between 1.5 nm/s and 4 nm/s.

9. The method of claim 1, whereby the semiconductor layer after completion of the formation has a surface roughness (rms) of less than 1.8 nm and/or a peak-to-valley height difference of less than 5 nm.

10. The method of claim 1, whereby a further step is carried out after the forming of the semiconductor layer, during said further step a second semiconductor layer being formed having a Germanium concentration in a range between 50<x<100%, said second semiconductor layer being formed at a second substrate temperature.

11. The method of claim 1, whereby said growth chamber is a high-density, low-energy plasma enhanced chemical vapor deposition (LEPECVD) chamber.

12. The method of claim 1, whereby a total reactive gas flow at the gas inlet is chosen between 5 sccm and 50 sccm.

13. The method of claim 10, whereby the second substrate temperature (T$_{S2}$) is in a range between the substrate temperature (T$_S$) used during the forming of the semiconductor layer and the substrate temperature (T$_S$) minus 50° C.

* * * * *